(12) United States Patent
Umeda et al.

(10) Patent No.: US 6,768,379 B2
(45) Date of Patent: Jul. 27, 2004

(54) AMPLIFIER CIRCUIT (75) Inventors: Toshiyuki Umeda, Inagi (JP); Shoji Otaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/950,625

(22) Filed: Sep. 13, 2001

(65) Prior Publication Data
US 2002/0044020 A1 Apr. 18, 2002

(30) Foreign Application Priority Data
Sep. 29, 2000 (JP) ........................................ 2000-298278

(51) Int. Cl.$^7$ ................................................ H03F 3/45
(52) U.S. Cl. ...................... 330/261; 330/254; 327/359
(58) Field of Search ............................... 330/254, 261; 327/346, 359

(56) References Cited

U.S. PATENT DOCUMENTS

| | | | | |
|---|---|---|---|---|
| 3,210,683 A | * | 10/1965 | Pay | ............................ 330/71 |
| 3,676,789 A | * | 7/1972 | Bray | ........................... 330/29 |
| 3,909,738 A | * | 9/1975 | Niimi | .......................... 330/30 |
| 4,146,844 A | | 3/1979 | Quinn | |
| 4,247,825 A | | 1/1981 | Berger | |
| 4,780,690 A | * | 10/1988 | Voorman | .................... 330/294 |
| 5,343,163 A | | 8/1994 | Linder et al. | |
| 5,465,415 A | * | 11/1995 | Bien | ........................... 455/326 |
| 5,990,740 A | | 11/1999 | Groe | |
| 5,990,741 A | * | 11/1999 | Yamamoto et al. | ......... 330/253 |
| 6,100,760 A | * | 8/2000 | Maruyama et al. | ......... 330/254 |
| 6,563,384 B1 | * | 5/2003 | Brokaw | ...................... 330/257 |

FOREIGN PATENT DOCUMENTS

| | | |
|---|---|---|
| EP | 0 324 273 | 7/1989 |
| GB | 2 287 370 | 9/1995 |
| GB | 2 323 728 | 9/1998 |
| JP | 11-088054 | 3/1999 |
| KR | 1999-0062584 | 7/1999 |

OTHER PUBLICATIONS

Hiroshi Tanimoto, et al., "Realization of a 1–V Active Filter Using a Linearization Technique Employing Plurality of Emitter–Coupled Pairs", IEEE Journal of Solid–State Circuits, vol. 26, No. 7, Jul. 1991, pp. 937–945.

* cited by examiner

Primary Examiner—Henry Choe
(74) Attorney, Agent, or Firm—Oblon, Spivak, McClelland, Maier & Neustadt, P.C.

(57) ABSTRACT

An amplifier circuit comprises a differential amplifier configured by a differential pair of transistors, a common emitter amplifier connected in parallel to the differential amplifier and configured by a pair of common-emitter configuration transistors, input and output terminals which are common to the differential amplifier and the common emitter amplifier, and a bias controller connected to the differential amplifier and the common emitter amplifier and configured to control a bias of at least one of the differential amplifier and the common emitter amplifier.

18 Claims, 7 Drawing Sheets

AMPLIFIER CIRCUIT

CROSS-REFERENCE TO RELATED APPLICATIONS

This application is based upon and claims the benefit of priority from the prior Japanese Patent Application No. 2000-298278, filed Sep. 29, 2000, the entire contents of which are incorporated herein by reference.

BACKGROUND OF THE INVENTION

1. Field of the Invention

The present invention relates to an amplifier circuit, particularly to an amplifier circuit including a problem such that a distortion occurs in spread spectrum communication.

2. Description of the Related Art

There will now be described a linear amplifier as one example of a conventional amplifier circuit. The linear amplifier inputs a low level signal, linearly amplifies the signal, and subsequently outputs a desired signal. In general, the linear amplifier comprises a differential amplifier. When the differential amplifier is supplied with a voltage signal and outputs a current signal, a load resistor converts the current signal to a voltage. A current gain $\Delta I_1$ of the differential amplifier in voltage-to-current conversion is represented by the following equation using $V_{in}$ as an input signal amplitude.

$$\Delta I_1 = A \cdot \tanh\left(\frac{V_{in}}{2V_T}\right) \quad (1)$$

Here A denotes a current value of a constant current source of a differential pair of transistors, and VT denotes a thermal voltage. When tanh_x is approximated, $\tanh\_x \approx x - x^3/3$ can be represented. Therefore, the equation (1) can be represented as follows.

$$\Delta I_1 = A\left(\frac{V_{in}}{2V_T} - \frac{1}{3}\left(\frac{V_{in}}{2V_T}\right)^3\right) \quad (2)$$

Here a second term indicates a distortion component. Particularly a third-order intermodulation distortion (IM3) poses a largest problem as an adjacent channel leakage power of the signal in a spread spectrum radio system. The distortion is generated by presence of the term. Since VT is 26 mV at room temperature, and when IM3 is lowered to −60 dBc or less as a condition for distortion reduction, $V_{in}$ needs to be 2.8 mV or less. Therefore, the aforementioned linear amplifier has a reduced distortion only when the input signal amplitude is very small. The linear amplifier cannot be utilized in an amplifier in which a signal to be handled is large in a range of 10 mVpp to 1 Vpp, particularly in a power amplifier.

The third-order intermodulation distortion as a main factor of distortion of the amplifier increases when an output power is increased. Therefore, in order to amplify the signal at the reduced distortion, a method of reducing the output power per one stage of the amplifier and obtaining a gain by a multi-stage structure of an amplifier is used. However, this poses problems such as an increase of power consumption, increase of a mounting area by an increase of the number of chips, and cost increase.

It is an object of the present invention to provide an amplifier circuit in which the third-order intermodulation distortion is inhibited without suppressing the output power.

BRIEF SUMMARY OF THE INVENTION

According to a first aspect of the invention, there is provided an amplifier circuit comprising: a differential amplifier configured by a differential pair of transistors; a common emitter amplifier connected in parallel to the differential amplifier and configured by a pair of common-emitter configuration transistors; input and output terminals which are common to the differential amplifier and the common emitter amplifier, an input signal being input to the input terminals and an output signal output from the output terminal; and a bias controller configured to control a bias of at least one of the differential amplifier and the common emitter amplifier.

According to a second aspect of the invention, there is provided an amplifier circuit comprising: a first amplifier whose input-to-output characteristic indicates a hyperbolic tangent function characteristic; a second amplifier whose input-to-output characteristic indicates an exponential characteristic, the second amplifier being connected in parallel to the first amplifier; input and output terminals which are common to the differential amplifier and the common emitter amplifier; and a bias controller configured to control a bias of at least one of the first and second amplifiers.

DETAILED DESCRIPTION OF THE INVENTION

According to an amplifier circuit of the present invention, the voltage signal input-to-current signal output characteristic of one of two signal amplifiers connected in parallel with each other indicates the exponential characteristic. The voltage signal input-to-current signal output characteristic of the other of the signal amplifiers indicates a hyperbolic tangent function characteristic. The amplifier of the hyperbolic tangent function characteristic can be realized by a differential amplifier as represented by the equation (1).

On the other hand, the amplifier of the exponential characteristic can be realized by common-emitter transistors. In this case, when a current gain during a certain biasing in the common-emitter amplifier is $\Delta I_2$, the following equation results.

$$\Delta I_2 = B \cdot \exp\left(\frac{V_{in}}{2V_T}\right) \quad (3)$$

Here, B denotes a constant. When the common-emitter amplifier is used for a differential signal, and the exponential function is developed, the current gain is represented by the following equation.

$$\Delta I_2 = 2B\left(\frac{V_{in}}{2V_T} + \frac{1}{6}\left(\frac{V_{in}}{2V_T}\right)^3\right) \quad (4)$$

A second term of the equation (4) denotes IM3, but a coefficient is positive, while the coefficient is negative in the equation (2).

Since the signal amplifier circuit having the exponential characteristic and the signal amplifier circuit having the hyperbolic tangent function characteristic are connected in parallel with each other, a combined output current $\Delta I$ is represented as follows from the equations (2) and (4).

$$\Delta I = \Delta I_1 + \Delta I_2 = (A + 2B)\left(\frac{V_{in}}{2V_T}\right) + \left(\frac{B-A}{3}\right)\left(\frac{V_{in}}{2V_T}\right) \quad (5)$$

On a condition of B=A, the following equation results.

$$\Delta I = 3A\left(\frac{V_{in}}{2V_T}\right) \quad (6)$$

An ideal power amplifier is obtained in which a distortion term is completely cancelled and a desired signal is amplified.

Embodiments of the present invention will be described hereinafter with reference to the drawings.

Figure 1:
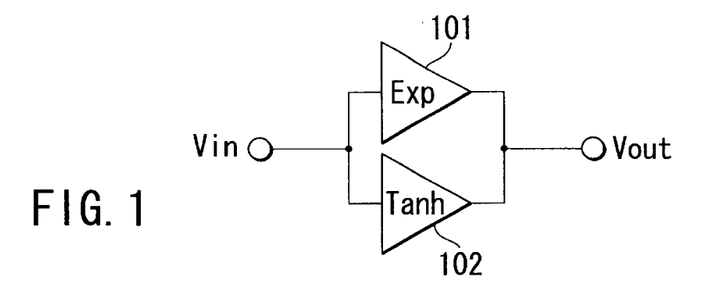
FIG. 1 is a block diagram showing a basic configuration of an amplifier circuit according to a first embodiment.

FIG. 1 is a block diagram showing a basic configuration of an amplifier circuit according to a first embodiment. In FIG. 1 a signal is inputted via an input signal terminal $V_{in}$, and outputted via an output signal terminal $V_{out}$. The amplifier circuit of the first embodiment comprises two signal amplifier circuits connected in parallel with each other, and a signal input terminal and signal output terminal are common with the circuits. One of the two signal amplifiers is an amplifier (hereinafter referred to as "exponential circuit") 101 whose signal input/output characteristic (voltage signal input current signal output characteristic) is substantially an exponential characteristic, and the other is an amplifier (hereinafter referred to as "tanh circuit") 102 which substantially has a hyperbolic tangent function characteristic.

Figure 2:
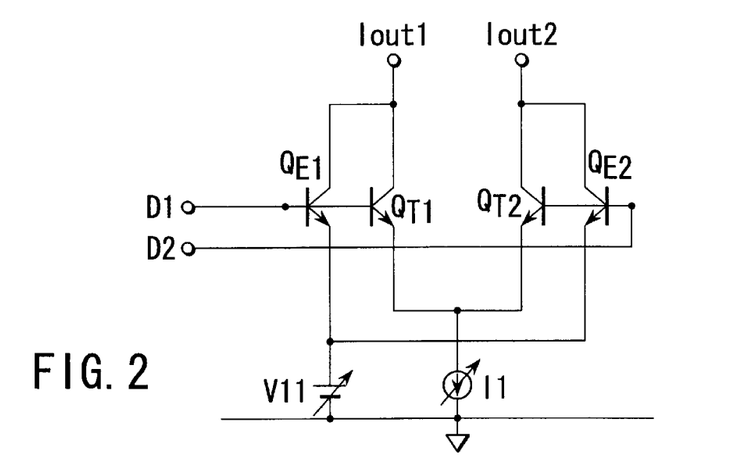
FIG. 2 is a circuit diagram showing a configuration of the amplifier circuit according to the first embodiment.

FIG. 2 is a circuit diagram showing a concrete configuration of the amplifier circuit of FIG. 1. A differential amplifier of bipolar transistors $Q_{T1}$ and $Q_{T2}$ corresponds to the tanh circuit, and a variable current source $I_1$ comprises a common current source of the differential pair of transistors. Common-emitter bipolar transistors $Q_{E1}$ and $Q_{E2}$ correspond to the exponential circuit, and respective emitters thereof are grounded via a variable voltage source $V_{11}$. Base terminals of the transistors $Q_{T1}$ and $Q_{E1}$ are connected to a signal input terminal $D_1$, and the bases of the transistors $Q_{T2}$ and $Q_{E2}$ are connected to a signal input terminal $D_2$. A differential signal is inputted via the terminals $D_1$ and $D_2$. Collector terminals of the transistors $Q_{T1}$ and $Q_{E1}$ are connected as a common terminal to a signal output terminal $I_{out1}$, and the collectors of the transistors $Q_{T2}$ and $Q_{E2}$ are connected as the common terminal to a signal output terminal $I_{out2}$.

It is assumed that a current value of the variable current source $I_1$ of the differential pair of transistors $Q_{T1}$ and $Q_{T2}$ is $I_{E1}$. In this case, a coefficient A of equation (1) substantially indicates a value of $I_{E1}$. On the other hand, it is assumed that a voltage value of the variable voltage source $V_{11}$ for determining emitter potentials of the common-emitter transistors $Q_{E1}$ and $Q_{E2}$ is $V_{E1}$. Moreover, the signal input terminals $D_1$ and $D_2$ are fixed at a predetermined bias potential $V_{B1}$, and a coefficient B of equation (3) indicates a value determined by $V_{B1}$ and $-V_{E1}$. The potential $V_{E1}$ is adjusted so as to be B=A. A distortion term therefore is cancelled as shown in equation (6), and a current characteristic having an inhibited third-order intermodulation distortion is obtained.

As described above, the voltage value $V_{E1}$ of the variable voltage source $V_{11}$ is changed, and the value is adjusted to be optimum so that the equation (6) is obtained. In an alternate method, an optimum value of an emitter size or an optimum value of the number of transistors is estimated with respect to the transistors $Q_{T1}$, $Q_{T2}$, $Q_{E1}$ and $Q_{E2}$ in a design stage, and $I_1$, $V_{11}$ may be designed as fixed sources.

Additionally, the first embodiment has been described using the bipolar transistors $Q_{T1}$ and $Q_{T2}$ as the transistors comprising the differential amplifier corresponding to the tanh circuit, but the transistors comprising the differential amplifier are not limited to the bipolar transistors, and MOS type field effect transistors or Schottky junction type field effect transistors may be used. Moreover, the current source $I_1$ and voltage source $V_{11}$ correspond to bias controllers configured to control bias levels of the tanh circuit and exponential circuit, respectively.

Figure 3:
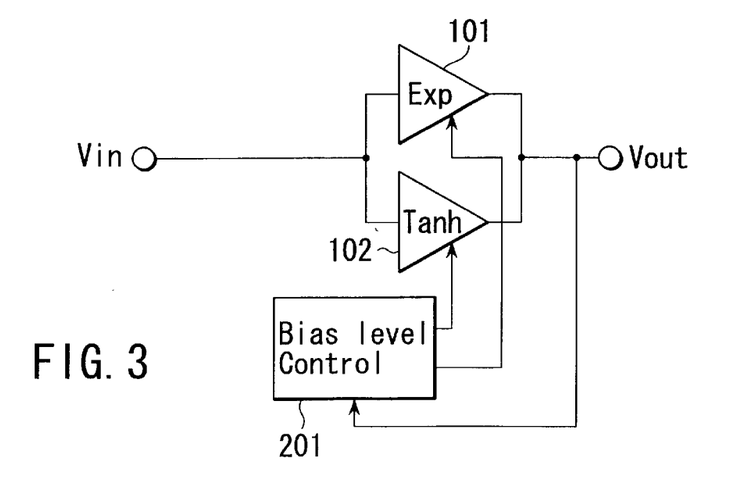
FIG. 3 is a block diagram showing the basic configuration of the amplifier circuit according to a second embodiment.

FIG. 3 is a block diagram showing the basic configuration of the amplifier circuit according to a second embodiment. The same structure elements as those of FIG. 1 are denoted with the same reference numerals as those of FIG. 1. The second embodiment is different from the embodiment of FIG. 1 in that a bias level control circuit (bias controller) 201 is connected to the exponential circuit 101 and tanh circuit 102.

Figure 4:
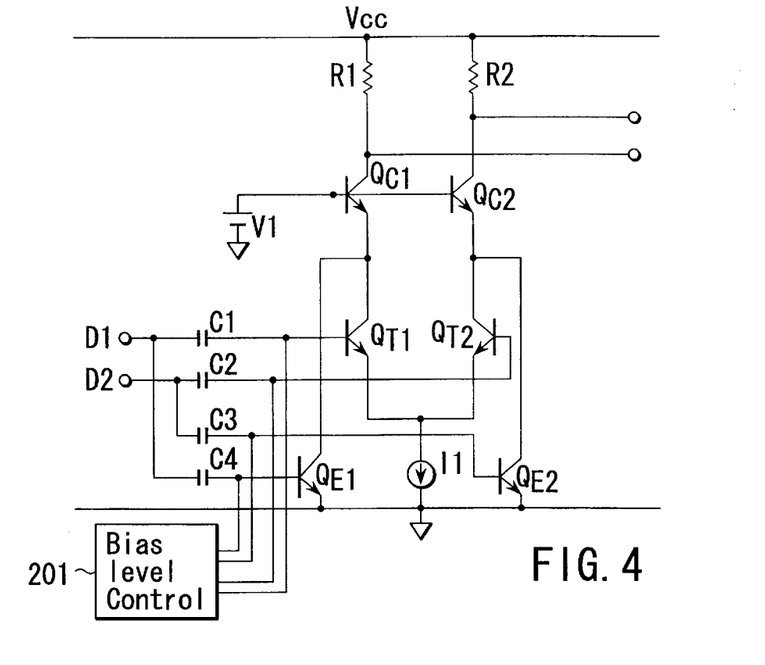
FIG. 4 is a circuit diagram showing the configuration of the amplifier circuit according to the second embodiment.

FIG. 4 shows another embodiment for realizing the concrete circuit configuration of FIG. 3. The transistors $Q_{T1}$ and $Q_{T2}$ comprise a differential transistor circuit, and the constant current source $I_1$ comprises a common current source of the differential pair of transistors. The transistors $Q_{E1}$ and $Q_{E2}$ are common-emitter transistors whose emitters are grounded. The bases of the transistors $Q_{T1}$ and $Q_{E1}$ are connected to the signal input terminal $D_1$ via capacitors $C_1$ and $C_4$, respectively, and the bases of the transistors $Q_{T2}$ and $Q_{E2}$ are connected to the signal input terminal $D_2$ via capacitors $C_2$ and $C_3$, respectively. The differential signal is inputted via the terminals $D_1$ and $D_2$. The collectors of the transistors $Q_{T1}$ and $Q_{E1}$ are connected as the common terminal to a signal output terminal $O_2$ via a cascode connection transistor $Q_{C1}$, and the collectors of the transistors $Q_{T2}$ and $Q_{E2}$ are connected as the common terminal to a signal output terminal $O_1$ via a cascode connection transistor $Q_{C2}$.

Respective bias potentials of the transistors $Q_{T1}$, $Q_{T2}$, $Q_{E1}$ and $Q_{E2}$ are supplied from the bias level control circuit 201. It is assumed that the bias potential supplied to the transistors $Q_{T1}$ and $Q_{T2}$ is $V_{B2}$, and the bias potential supplied to the transistors $Q_{E1}$ and $Q_{E2}$ is $V_{B3}$. The coefficient A of the equation (1) is determined by the value of the constant current source $I_1$ regardless of the value of $V_{B2}$. On the other hand, the coefficient B of the equation (3) depends on the value of $V_{B3}$. Therefore, the value of $V_{B3}$ is adjusted so as to be B=A. As a result, the current characteristic causing no third-order intermodulation distortion is obtained from the equation (6). Additionally, the current source $I_1$ may be a variable current source. In this case, the current value of the current source $I_1$ may be adjusted so as to be B=A, or both $V_{B3}$ and $I_1$ may be adjusted so as to be B=A.

AS described above the voltage value $V_B$ or the current value of the current source $I_1$ is changed by the bias level control circuit. The value is adjusted to be optimum so that the equation (6) is obtained. However, in the alternative method, the optimum value of the emitter size or the optimum value of the number of transistors is estimated with respect to the transistors $Q_{T1}$, $Q_{T2}$, $Q_{E1}$ and $Q_{E2}$ in the design stage, and the bias level or $I_1$ is designed as the fixed source.

Figure 5:
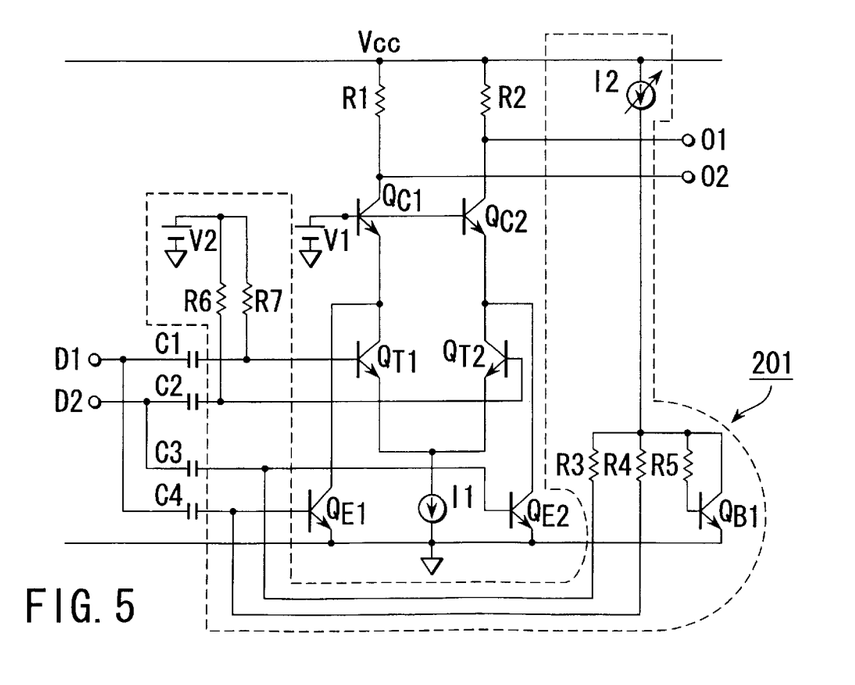
FIG. 5 is a circuit diagram showing a configuration of a bias level control circuit 201 of FIG. 4.

FIG. 5 is a circuit diagram showing a concrete configuration of the bias level control circuit 201 of FIG. 4. The bias level control circuit 201 comprises a voltage source $V_2$, variable current source $I_2$, resistors $R_3$, $R_4$, $R_5$, $R_6$ and $R_7$, and transistor $Q_{B1}$. The transistors $Q_{T1}$ and $Q_{T2}$ are biased at fixed voltages of $V_2$, $R_6$ and $R_7$. The bias levels of the transistors $Q_{E1}$ and $Q_{E2}$ are generated by a mirror circuit comprising the variable current source $I_2$, and resistors $R_3$, $R_4$ and $R_5$, and transistor $Q_{B1}$. The collector bias currents of the transistors $Q_{E1}$ and $Q_{E2}$ are a current proportional to the current value $I_{C1}$ of the variable current source $I_2$. The coefficient A of the equation (1) is determined by the current value of the constant current source $I_1$.

On the other hand, the coefficient B of the equation (3) depends on the current value $I_{C1}$. Therefore, the current value $I_{C1}$ is adjusted so as to be B=A, whereby the current characteristic causing no third-order intermodulation distortion is obtained from the equation (6). Additionally, the current source $I_1$ may be a variable current source. In this case, the current value of the current source $I_1$ may be adjusted so as to be B=A, or both $V_{B3}$ and $I_1$ may be adjusted so as to be B=A.

As described above the current value $I_{C1}$ or the value of the current source $I_{C1}$ is changed by the bias level control circuit, and the value is adjusted to be optimum so that the equation (6) is obtained. However, in the alternative method, the optimum value of the emitter size or the optimum value of the number of transistors is estimated with respect to the transistors $Q_{T1}$, $Q_{T2}$, $Q_{E1}$ and $Q_{E2}$ in the design stage, and the bias level or $I_1$ is designed as the fixed source.

Figure 6:
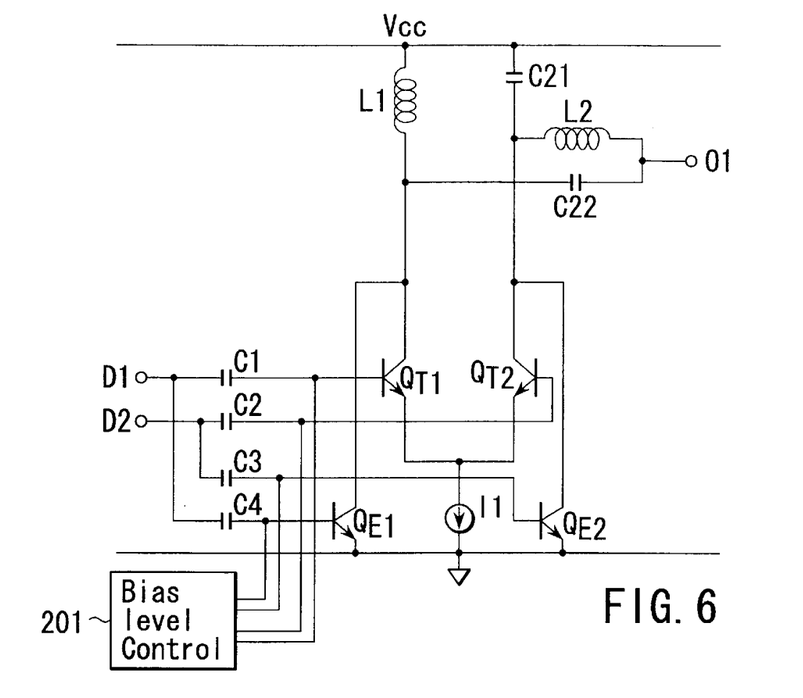
FIG. 6 is a circuit diagram showing another configuration of the amplifier circuit according to the second embodiment.

FIG. 6 is a circuit diagram showing another example of the amplifier circuit according to the second embodiment. Here, an inductor $L_1$ is used as a common load of the transistors $Q_{T1}$ and $Q_{E1}$, and connected to the output terminal $O_1$ via a capacitor $C_{22}$. A capacitor $C_{21}$ is used as the common load of the transistors $Q_{T2}$ and $Q_{E2}$, and connected to the output terminal $O_1$ via an inductor $L_2$. That is, $O_1$ is a common output terminal with respect to a differential signal, and a differential to single-phase conversion is achieved.

Assuming that a signal frequency is f, values of the inductance $L_1$ and $L_2$ and capacitance $C_{21}$ and $C_{22}$ satisfying the following equation are selected.

$$f = \frac{1}{2\pi\sqrt{L_1 \cdot C_{22}}} = \frac{1}{2\pi\sqrt{L_2 \cdot C_{21}}} \quad (7)$$

Then, a phase shifts by +/−90 degrees at the frequency f. As a result, an amplified signal with the same phase is outputted via the output terminal $O_1$.

Figure 7:
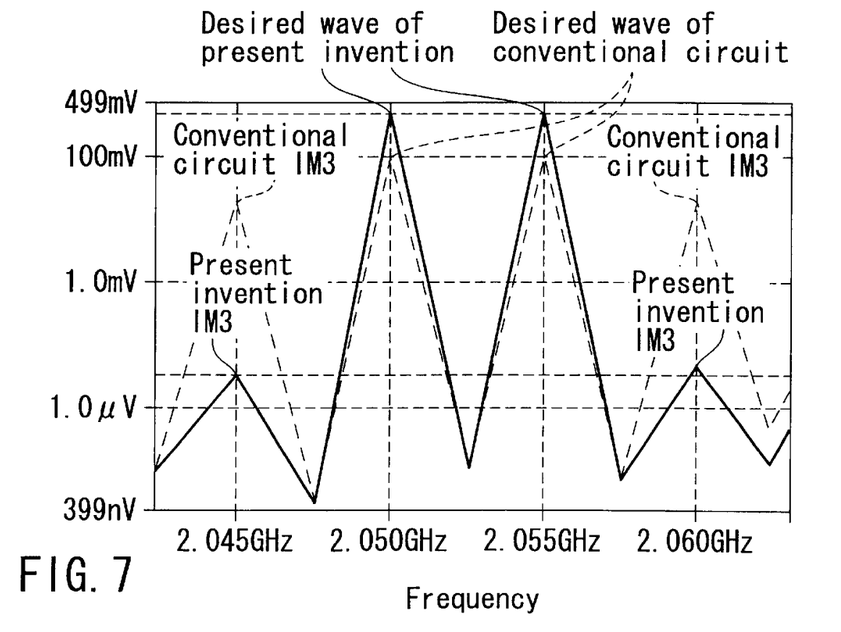
FIG. 7 is an output signal spectrum diagram when a two-tone signal is inputted to the circuit of FIG. 4.

FIG. 7 shows an output signal spectrum by a solid line when a two-tone high-frequency signal is inputted to the circuit of the present invention described with reference to FIG. 4. Moreover, a major signal spectrum of a general differential circuit as a conventional circuit is shown by a broken line. Here, it is assumed that the circuit (FIG. 4) of the present invention and the conventional circuit have the same power consumption. The input signal includes two tones of 2.05 GHz and 2.055 GHz, and an input signal power is −10 dBm. In the circuit (FIG. 4) of the present invention, the output signal indicates 350 mV. This is an output power of 0 dBm or more. The third-order intermodulation distortion is generated in frequencies of 2.045 GHz and 2.06 GHz. However, the third-order intermodulation distortion is of the order of 40 uV in the circuit (FIG. 4) of the present invention. Therefore, the distortion indicates −78 dBc, and is very small for a large signal output.

On the other hand, in the conventional circuit, the output is of the order of 150 mV and the output power is of the order of −6 dBm.

In this case, the third-order intermodulation distortion of −23 dBc is generated at 10 mV, and this is a level which causes a practical trouble. These results reveal that the circuit (FIG. 4) of the present invention increases the output power with respect to the desired signal, and provides an effect of remarkably reducing the distortion as compared with the conventional circuit.

Figure 8:
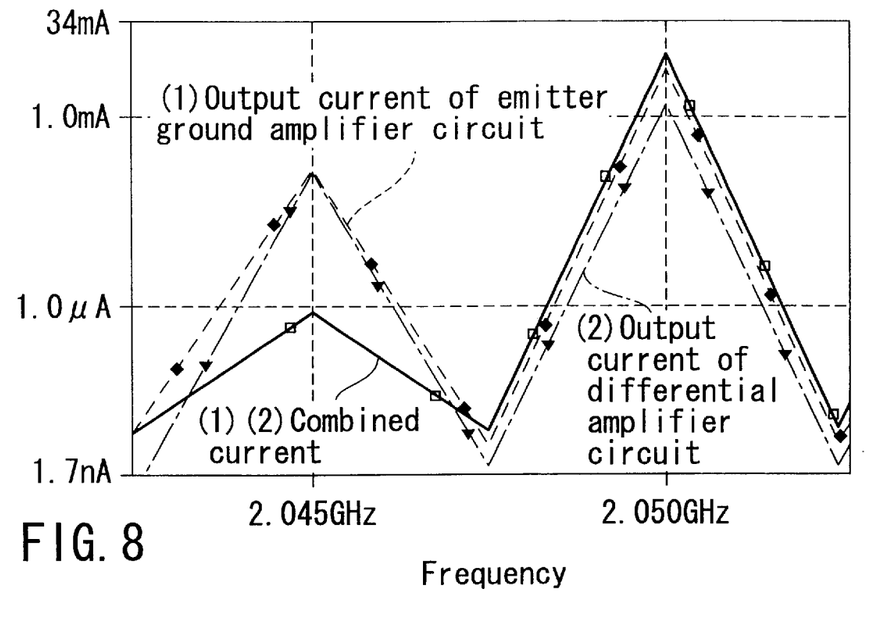
FIG. 8 is a signal spectrum diagram of respective collector currents of transistors $Q_{T1}$, $Q_{E1}$, $Q_{C1}$ when the two-tone signal is inputted to the circuit of FIG. 4.

FIG. 8 shows signal currents passed through the differential amplifier and common-emitter amplifier of the amplifier circuit when an output signal spectrum during input of two tones of high-frequency signal into the circuit of FIG. 4 is measured, and a signal spectrum of a current obtained by combining the signal currents by a common collector. Similarly as FIG. 7, assuming that the frequencies of the input signal are 2.05 GHz and 2.055 GHz, the third-order intermodulation distortion is measured at 2.045 GHz.

When the third-order intermodulation distortion is noted, large values of both an output current (1) of the common-emitter amplifier and an output current (2) of the differential amplifier are generated, but these values are substantially equal to each other. On the other hand, the value of the combined current of these currents is a value extremely lower than the value of each of the output currents. This result is similar to a principle in which the distortion is offset by parallel connection of the amplifier having the exponential characteristic and the amplifier having the hyperbolic tangent function characteristic in equation (5). The measurement result shows that the amplifier circuit can be realized in a practically useful state. Furthermore, for the spectrum of 2.05 GHz of the desired signal, the combined current indicates an added value of the respective signal currents of the common-emitter amplifier and differential amplifier, and both amplifiers effectively strengthen each other with respect to the desired signal.

Figure 9:
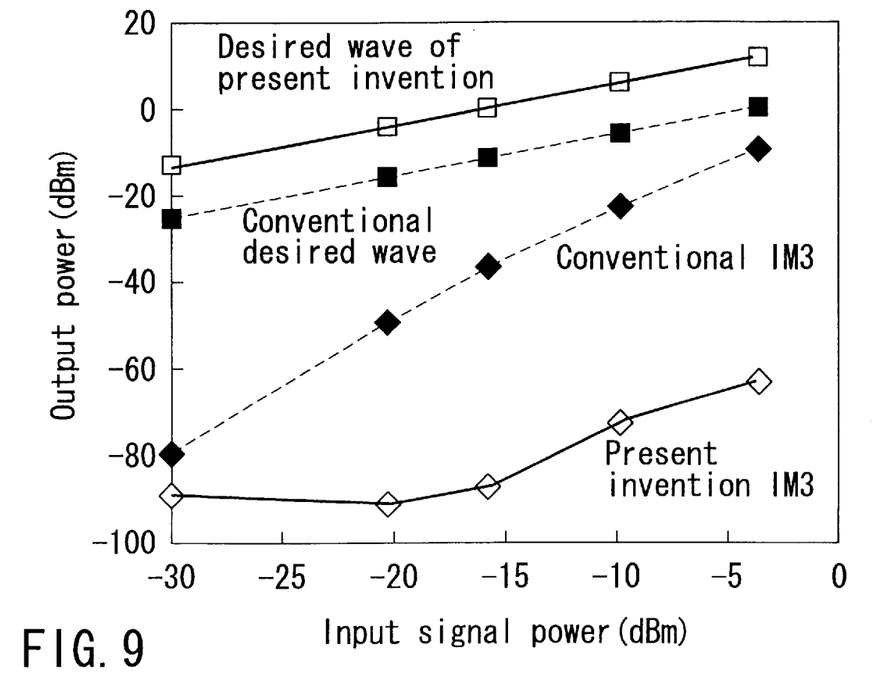
FIG. 9 is a diagram of power signal input/output characteristics (desired wave and IM3) of the circuit of FIG. 4 and a conventional circuit.

FIG. 9 shows signal input/output characteristics of the circuit (FIG. 4) of the present invention and the conventional general differential circuit with the same power consumption. A solid line shows the desired signal and third-order intermodulation distortion characteristic in the circuit (FIG. 4) of the present invention, and a broken line shows the desired signal and third-order intermodulation distortion characteristic in the conventional circuit. The circuit (FIG. 4) of the present invention shows a result of adjustment of a bias in order to obtain an optimum third-order intermodulation distortion characteristic for each signal input power. According to the result, in the circuit of the present invention, a gain of 10 dB is obtained, and an output power of 10 dBm or more is obtained. Even in this case, the third-order intermodulation distortion is −70 dBc or less and a very satisfactory characteristic is obtained.

On the other hand, in the conventional circuit, the gain is as low as about 4 dB, the distortion is −10 dBc during output of 0 dBm, and the result is very bad as compared with the present invention.

Figure 10:
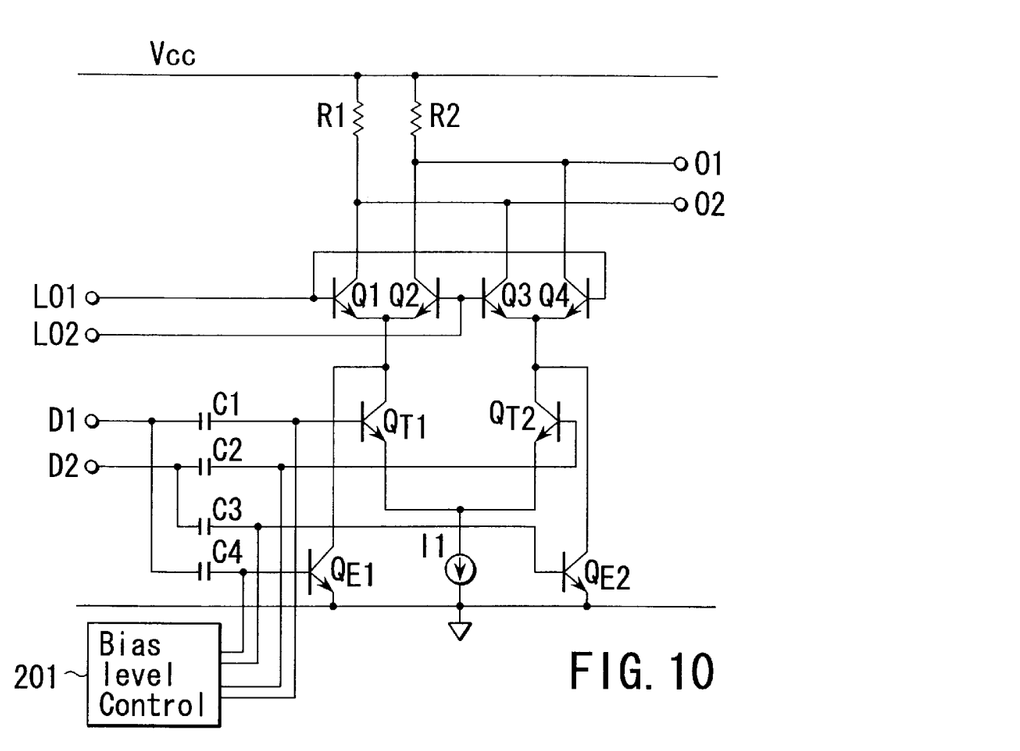
FIG. 10 is a circuit diagram showing a circuit configuration in which the second embodiment is applied to a mixer circuit.

FIG. 10 is a circuit diagram showing a circuit configuration in which the second embodiment is applied to a mixer circuit. The transistors $Q_{T1}$ and $Q_{T2}$ comprises the differential transistor circuit, and the constant current source $I_1$ comprises the common current source of the differential pair of transistors. The transistors $Q_{E1}$ and $Q_{E2}$ are common-emitter transistors and respective emitters thereof are grounded. The bases of the transistors $Q_{T1}$ and $Q_{E1}$ are connected to the signal input terminal $D_1$ via the capacitors $C_1$ and $C_4$, respectively, and the bases of the transistors $Q_{T2}$ and $Q_{E2}$ are connected to the signal input terminal $D_2$ via the capacitors $C_2$ and $C_3$, respectively. The differential signal is inputted via the terminals $D_1$ and $D_2$.

Transistors $Q_1$, $Q_2$ and $Q_3$, $Q_4$ comprise respective differential pair of transistors, the bases of the transistors $Q_1$ and $Q_4$ are connected to a local oscillation signal input terminal $LO_1$, and the bases of the transistors $Q_2$ and $Q_3$ are connected to a local oscillation signal input terminal $LO_2$. The differential signal is inputted via $LO_1$ and $LO_2$. The collectors of the transistors $Q_{T1}$ and $Q_{E1}$ are connected as the common terminal to the signal output terminals $O_1$ and $O_2$ via common emitter of the transistors $Q_1$ and $Q_2$, and the collectors of the transistors $Q_{T2}$ and $Q_{E2}$ are connected as the common terminal to the signal output terminals $O_1$ and $O_2$ via the common emitter of the transistors $Q_3$ and $Q_4$.

The respective bias potentials of the transistors $Q_{T1}$, $Q_{T2}$, $Q_{E1}$ and $Q_{E2}$ are supplied from the bias level control circuit 201. It is assumed that the bias potential supplied to the transistors $Q_{T1}$ and $Q_{T2}$ is $V_{B2}$, and the bias potential supplied to the transistors $Q_{E1}$ and $Q_{E2}$ is $V_{B3}$. The coefficient A of the equation (1) is determined by the value of the constant current source $I_1$ regardless of the value of $V_{B2}$. On the other hand, the coefficient B of the equation (3) depends on the value of $V_{B3}$. Therefore, the value of $V_{B3}$ is adjusted so as to be B=A, and the current characteristic causing no third-order intermodulation distortion is therefore obtained from the equation (6). Additionally, the current source $I_1$ may be a variable current source. In this case, the value of $I_1$ may be adjusted so as to be B=A, or both $V_{B3}$ and $I_1$ may be adjusted so as to be B=A.

As described above, the voltage value $V_{B3}$ or the value of the current source $I_1$ is changed by the bias level control circuit, and the value is adjusted to be optimum so that the equation (6) is obtained. However, in the alternative method, the optimum value of the emitter size or the optimum value of the number of transistors is estimated with respect to the transistors $Q_{T1}$, $Q_{T2}$, $Q_{E1}$ and $Q_{E2}$ in the design stage, and the bias level or $I_1$ is designed as the fixed source.

Figure 11:
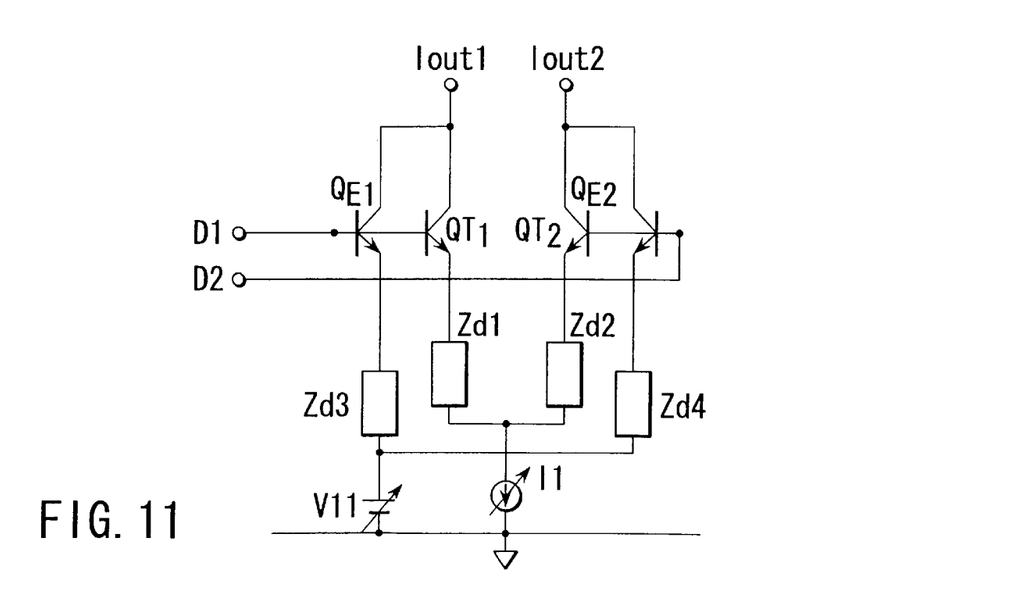
FIG. 11 is a circuit diagram of another example including the circuit configuration of FIG. 2.

FIG. 11 shows a circuit diagram of another embodiment comprising the circuit configuration of FIG. 2. The transistors $Q_{T1}$ and $Q_{T2}$ comprise the complementary transistor circuit, the emitters of the transistors $Q_{T1}$ and $Q_{T2}$ are connected to impedance elements $Zd_1$ and $Zd_2$, respectively, and the other ends of the impedance elements $Zd_1$ and $Zd_2$ are connected to the variable current source $I_1$. The variable current source $I_1$ comprises the common current source of the differential pair of transistors. The transistors $Q_{E1}$ and $Q_{E2}$ are common-emitter transistors, the respective emitters thereof are connected to impedance elements $Zd_3$ and $Zd_4$, respectively, and the other ends of the impedance elements $Zd_3$ and $Zd_4$ are grounded via the variable voltage source $V_{11}$. The bases of the transistors $Q_{T1}$ and $Q_{E1}$ are connected to the signal input terminal $D_1$, and the bases of the transistors $Q_{T2}$ and $Q_{E2}$ are connected to the signal input terminal $D_2$. The differential signal is inputted via the terminals $D_1$ and $D_2$. The collectors of the transistors $Q_{T1}$ and $Q_{E1}$ are connected as the common terminal to the signal output terminal $I_{out1}$, and the collectors of the transistors $Q_{T2}$ and $Q_{E2}$ are connected as the common terminal to the signal output terminal $I_{out2}$.

The current value of the variable current source $I_1$ of the differential pair of transistors $Q_{T1}$ and $Q_{T2}$ is set to $I_{E1}$. In this case, the coefficient A of the equation (1) substantially indicates a value of $I_{E1}$. On the other hand, the voltage value of the variable voltage source $V_{11}$ for determining the emitter potentials of the common-emitter transistors $Q_{E1}$ and $Q_{E2}$ is set to $V_{E1}$. Moreover, the signal input terminals $D_1$ and $D_2$ are fixed at the predetermined bias potential VB1, and the coefficient B of the equation (3) indicates a value determined by $V_{B1}$ and $-V_{E1}$. The value of $V_{E1}$ is adjusted so as to be B=A, and the current characteristic causing no third-order intermodulation distortion is obtained in the equation (6).

The impedance elements $Zd_1$, $Zd_2$, $Zd_3$ and $Zd_4$ function as degeneration elements in a used frequency band, VT in denominators of the equations (1) and (3) increases by a voltage generated at the degeneration elements, and therefore a fluctuation of ΔI to $V_{in}$ can be reduced. As a result, even when $V_{in}$ is used together with the system of the present invention and further increases, the distortion can be inhibited. Additionally, only the impedance elements $Zd_1$ and $Zd_2$ or $Zd_3$ and $Zd_4$ may be disposed.

As described above, the voltage value $V_{E1}$ of the variable current source $V_{11}$ is changed, and the value is adjusted to be optimum so that the equation (6) is obtained. However, in the alternative method, the optimum value of the emitter size or the optimum value of the number of transistors is estimated with respect to the transistors $Q_{T1}$, $Q_{T2}$, $Q_{E1}$ and $Q_{E2}$ in the design stage, and $I_1$ and $V_{11}$ are designed as the fixed sources.

Figure 12:
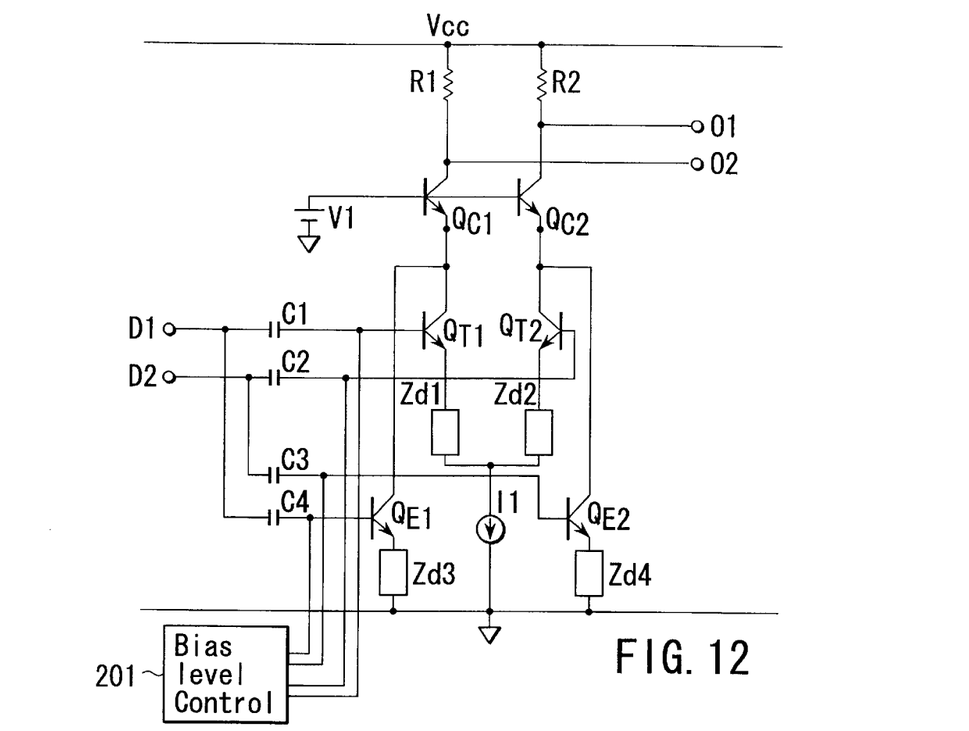
FIG. 12 is a circuit diagram of another embodiment comprising the circuit configuration of FIG. 4.

FIG. 12 is a circuit diagram of another embodiment comprising the circuit configuration of FIG. 4. The transistors $Q_{T1}$, $Q_{T2}$ comprise the complementary transistor circuit, the emitters of the transistors $Q_{T1}$, $Q_{T2}$ are connected to the impedance elements $Zd_1$ and $Zd_2$, respectively, and the other ends of the impedance elements $Zd_1$ and $Zd_2$ are connected to the constant current source $I_1$. The constant current source $I_1$ comprises the common current source of the differential pair of transistors. The transistors $Q_{E1}$ and $Q_{E2}$ are common-emitter transistors, and the respective emitters thereof are grounded via the impedance elements $Zd_3$ and $Zd_4$. The bases of the transistors $Q_{T1}$ and $Q_{E1}$ are connected to the signal input terminal $D_1$ via the capacitors $C_1$ and $C_4$, and the bases of the transistors $Q_{T2}$ and $Q_{E2}$ are connected to the signal input terminal $D_2$ via the capacitors $C_2$ and $C_3$. The differential signal is inputted via the terminals $D_1$ and $D_2$. The collectors of the transistors $Q_{T1}$ and $Q_{E1}$ are connected as the common terminal to the signal output terminal $O_1$ via the cascode connection transistor $Q_{C1}$, and the collectors of the transistors $Q_{T2}$ and $Q_{E2}$ are connected as the common terminal to the signal output terminal $O_2$ via the cascode connection transistor $Q_{C2}$.

The respective bias potentials of the transistors $Q_{T1}$, $Q_{T2}$, $Q_{E1}$ and $Q_{E2}$ are supplied from the bias level control circuit 201. The bias potential supplied to the transistors $Q_{T1}$ and $Q_{T2}$ is $V_{B2}$, and the bias potential supplied to the transistors $Q_{E1}$ and $Q_{E2}$ is $V_{B3}$. The coefficient A of the equation (1) is determined by the value of the constant current source $I_1$ regardless of the value of $V_{B2}$. On the other hand, the coefficient B of the equation (3) depends on the value of $V_{B3}$. Therefore, the value of $V_{B3}$ is adjusted so as to be B=A, and the current characteristic causing no third-order intermodulation distortion is therefore obtained from the equation (6). Additionally, the current source $I_1$ may be the variable current source. In this case, the value of $I_1$ may be adjusted so as to be B=A, or both $V_{B3}$ and $I_1$ may be adjusted so as to be B=A. The impedance elements $Zd_1$, $Zd_2$, $Zd_3$ and $Zd_4$ function as degeneration elements in the used frequency band, VT in denominators of the equations (1) and (3) increases by the voltage generated at the degeneration elements, and therefore the fluctuation of $\Delta I$ to $V_{in}$ can be reduced. As a result, even when $V_{in}$ is used together with the system of the present invention and further increases, the distortion can be cancelled.

As described above the voltage value $V_{B3}$ or the value of the current source $I_1$ is changed by the bias level control circuit, and the value is adjusted to be optimum so that the equation (6) is obtained. However, in the alternative method, the optimum value of the emitter size or the optimum value of the number of transistors is estimated with respect to the transistors $Q_{T1}$, $Q_{T2}$, $Q_{E1}$ and $Q_{E2}$ in the design stage, and the bias level or $I_1$ is designed as the fixed source.

Figure 13:
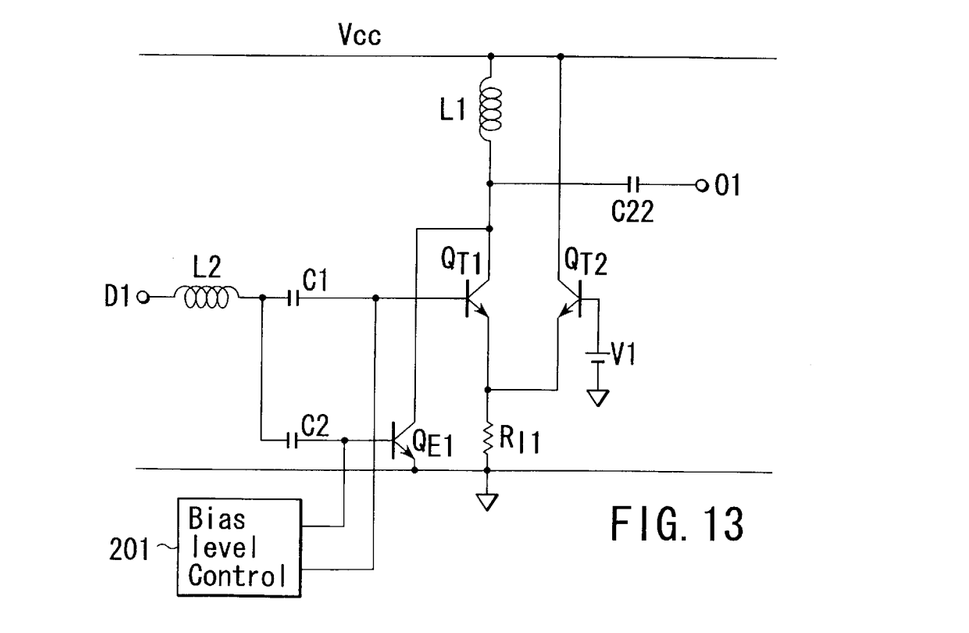
FIG. 13 is a circuit diagram of another embodiment in which the circuit configuration of FIG. 4 is applied to a single-phase signal input circuit.

FIG. 13 is a circuit diagram of another embodiment in which the present invention is applied to the single-phase signal input circuit. The transistors $Q_{T1}$ and $Q_{T2}$ comprise the complementary transistor circuit, and the constant current source $I_1$ comprises the common current source of the differential pair of transistors. The transistor $Q_{E1}$ is the common-emitter transistor and the emitter thereof is grounded. The bases of the transistors $Q_{T1}$ and $Q_{E1}$ are connected to the signal input terminal $D_1$ via the capacitors $C_1$ and $C_2$, respectively, and the potential of the base of the transistor $Q_{T2}$ is fixed by the constant voltage source $V_1$. A single-phase signal is inputted via the terminals $D_1$. The collector of the transistors $Q_{T1}$ and $Q_{E1}$ is the common terminal having a load of an inductor $L_1$, and connected to the signal output terminal O1 via the capacitor $C_{22}$.

The respective bias potentials of the transistors $Q_{T1}$ and $Q_{E1}$ are supplied from the bias level control circuit 201. The bias potential supplied to the transistor $Q_{T1}$ is set to $V_{B2}$, and the bias potential supplied to the transistor $Q_{E1}$ is set to $V_{B3}$. The value of $V_{B2}$ is set to be substantially the same as that of the bias potential $V_1$ of the transistor $Q_{T2}$. The coefficient A of the equation (1) is determined by the value of the current flowing through a resistor $R_{T1}$ regardless of the value of $V_{B2}$. On the other hand, the coefficient B of the equation (3) depends on the value of $V_{B3}$. Therefore, the value of $V_{B3}$ is adjusted so as to be B=A, and the current characteristic causing no third-order intermodulation distortion is therefore obtained from the equation (6).

As described above, the voltage value $V_{B3}$ is changed by the bias level control circuit 201, and the value is adjusted to be optimum so that the equation (6) is obtained. However, in the alternative method, the optimum value of the emitter size or the optimum value of the number of transistors is estimated with respect to the transistors $Q_{T1}$, $Q_{T2}$ and $Q_{E1}$ in the design stage, and the bias level is designed as the fixed source.

Figure 14:
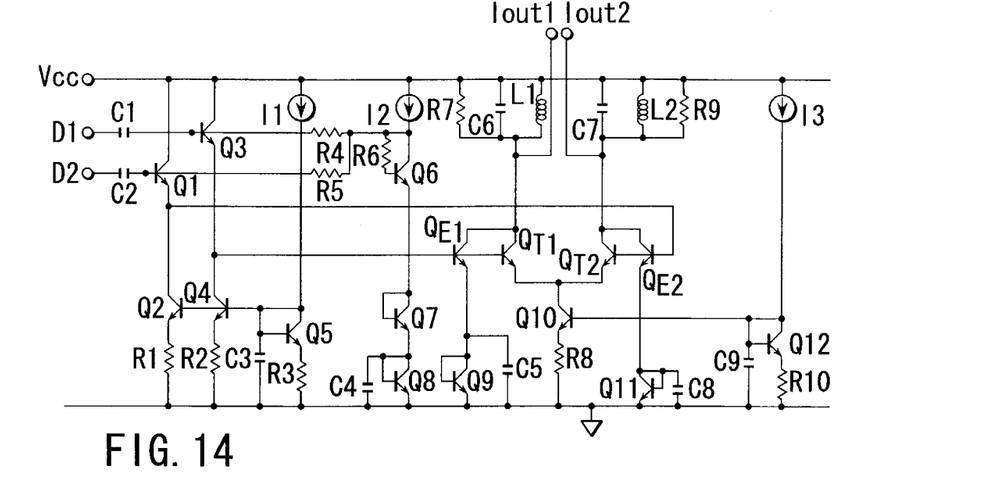
FIG. 14 is a circuit diagram of another embodiment showing a concrete circuit configuration of FIG. 3.

FIG. 14 is a circuit diagram of another embodiment showing the concrete circuit configuration of FIG. 3. The transistors $Q_{T1}$ and $Q_{T2}$ comprise the differential transistor circuit, and a transistor Q10 for the current source and a resistor R8 comprise the common current source of the differential pair of transistors. The transistors $Q_{E1}$ and $Q_{E2}$ are common-emitter transistors, and the respective emitters thereof are grounded via transistors $Q_9$ and $Q_{11}$ connected via the diode. Moreover, the emitters of the transistors $Q_{E1}$ and $Q_{E2}$ are grounded via capacitors $C_5$ and $C_8$ in a high frequency. The bases of the transistors $Q_{T1}$ and $Q_{E1}$ are connected in common to the emitter of an emitter follower transistor $Q_3$. The bases of the transistors $Q_{T2}$ and $Q_{E2}$ are similarly connected in common to the emitter of the emitter follower transistor $Q_1$. The transistors $Q_1$ and $Q_2$, and resistor $R_1$ comprise an emitter follower circuit, and the base of the transistor $Q_1$ is connected to the signal input terminal $D_2$ via the capacitor $C_2$. Similarly, the transistors $Q_3$ and $Q_4$, and resistor $R_2$ comprise the emitter follower circuit, and the base of the transistor $Q_3$ is connected to the signal input terminal $D_1$ via the capacitor $C_1$. The differential signal is inputted via the terminals $D_1$ and $D_2$. The collectors of the transistors $Q_{T2}$ and $Q_{E1}$ are connected as the common terminal to the signal output terminal $I_{out1}$. The inductor $L_1$, capacitor $C_6$, and resistor $R_7$ are connected as a load in parallel with one another between the terminal $I_{out1}$ and power source $V_{CC}$. The collectors of the transistors $Q_{T2}$ and $Q_{E2}$ are connected as the common terminal to the signal output terminal $I_{out2}$. The inductor $L_2$, capacitor $C_7$, and resistor $R_9$ are connected as the load in parallel with one another between the terminal $I_{out2}$ and power source $V_{CC}$.

The respective bias potentials of the paired transistors $Q_{T1}$ and $Q_{E1}$, and $Q_{T2}$ and $Q_{E2}$ are controlled by base potentials of the emitter follower transistors $Q_1$ and $Q_3$, respectively. The base potential is controlled by the current $I_2$ flowing through a current mirror circuit connected to the transistors via resistors $R_5$ and $R_4$. Here, the current mirror circuit comprises the current source $I_2$, resistor $R_6$, transistors $Q_6$, $Q_7$ and $Q_8$, and capacitor $C_4$.

The current flowing through the transistors $Q_{T1}$ and $Q_{T2}$ is controlled by the base potential of the transistor Q10 for the current source, and the base of the transistor is connected to the current mirror circuit configured by a current source $I_3$, transistor $Q_{12}$, resistor $R_{10}$, and capacitor $C_9$. Therefore, the current flowing through the transistors $Q_{T1}$ and $Q_{T2}$ is controlled by the current value of the current source $I_3$. The coefficient A of the equation (1) is determined by a control current value of the current source $I_3$, and the coefficient B of the equation (3) is determined by the control current value of the current source $I_2$. Therefore, the current source $I_3$ is adjusted in order to obtain a desired output power, and the current source $I_2$ is adjusted in order to remove the distortion by the output power. Thereby, the condition of B=A is satisfied during outputting of a desired signal, the distortion term is cancelled from the equation (6), and the current characteristic can be obtained in which the third-order intermodulation distortion is cancelled.

The method of adjusting the current sources I2 and I3, changing the base bias levels of the transistors $Q_{T1}$, $Q_{E1}$, $Q_{T2}$ and $Q_{E2}$ and the current values of the transistors $Q_{T1}$ and $Q_{T2}$ and obtaining the optimum value in the equation (6) has been described above. However, there is another method of estimating the optimum value of the emitter size or the optimum value of the number of transistors with respect to the transistors $Q_{T1}$, $Q_{E1}$, $Q_{T2}$ and $Q_{E2}$ in the design stage, and using the current sources $I_2$ and $I_3$ as the fixed sources.

Figure 15:
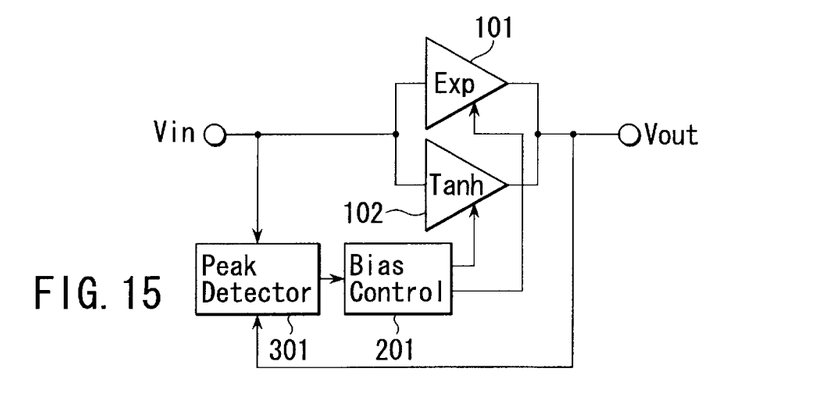
FIG. 15 is a block diagram showing the basic configuration of the amplifier circuit according to a third embodiment.

FIG. 15 is a block diagram showing the basic configuration of the amplifier circuit according to a third embodiment. In FIG. 15 the signal is inputted via the terminal $V_{in}$, and outputted via the terminal $V_{out}$. The amplifier circuit of the third embodiment comprises two amplifiers connected in parallel with each other, and the signal input terminal and signal output terminal are common with the circuits. One of the two amplifiers is the exponential circuit 101 whose signal input/output characteristic (voltage signal input-to-current signal output characteristic) is substantially the exponential characteristic, and the other is the tanh circuit 102 which substantially has the hyperbolic tangent function characteristic.

The present circuit configuration comprises the bias level control circuit 201 configured to control the bias voltages to be supplied to the two amplifiers, and a signal peak detector 301 that detects a peak value of the signal. At least one of a signal input section and signal output section inputs a signal value to the signal peak detector 301, and a control signal is inputted to the bias level control circuit 201 in accordance with the signal value. Based on this result, the bias voltages to be supplied to the two amplifiers are determined. According to the third embodiment, for the bias potential of the amplifier, even when the input signal power changes, an optimum bias potential is automatically supplied, and a satisfactory output signal with a suppressed distortion can be obtained.

Figure 16:
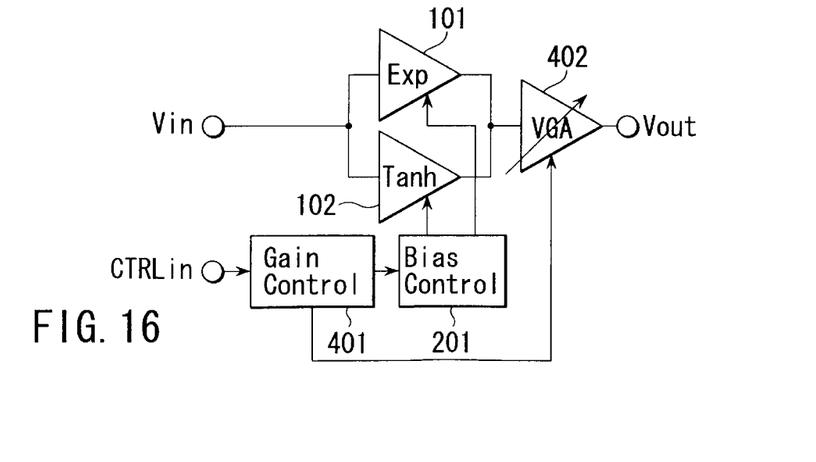
FIG. 16 is a block diagram showing the basic configuration of the amplifier circuit according to a fourth embodiment.

FIG. 16 is a block diagram showing the basic configuration of the amplifier circuit according to a fourth embodiment. In FIG. 16 the signal is inputted via the terminal $V_{in}$, and outputted via the terminal $V_{out}$. The amplifier circuit of the fourth embodiment comprises two amplifiers connected in parallel with each other, in which the signal input terminal and signal output terminal are common with the circuits; and a variable amplifier 402 connected in cascode (tandem) with outputs of two amplifiers. One of the two amplifiers is the exponential circuit 101 whose signal input/output characteristic (voltage signal input current signal output characteristic) is basically the exponential characteristic, and the other is the tanh circuit 102 which basically has the hyperbolic tangent function characteristic.

The present circuit configuration comprises the bias level control circuit 201 configured to control the bias voltages to be supplied to the two amplifiers, and a gain controller 401 configured to control a gain. The control signal is inputted via a control signal input terminal $CTRL_{in}$, and a gain control signal is inputted to the bias level control circuit 201 and variable amplifier 402 in response to the inputted control signal. As a result, the bias voltage to be supplied to the two amplifiers is determined in accordance with the gain control. According to the fourth embodiment, for the bias potential of the amplifier, even when the output signal power changes, an optimum bias potential is constantly supplied, and the satisfactory output signal with the suppressed distortion can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier circuit using a variable current source, comprising:
   a differential amplifier configured by a differential pair of transistors connected to the variable current source;
   a common emitter amplifier connected in parallel to the differential amplifier and configured by a pair of common-emitter configuration transistors;
   input and output terminals which are common to the differential amplifier and the common emitter amplifier, an input signal being input to the input terminals and an output signal output from the output terminals;
   a bias controller configured to control a bias of at least one of the differential amplifier and the common emitter amplifier; and
   a peak detector configured to detect a peak value of at least one of the input signal and the output signal.

2. An amplifier circuit using a variable current source, comprising:
   a differential amplifier configured by a differential pair of transistors connected to the variable current source;
   a common emitter amplifier connected in parallel to the differential amplifier and configured by a pair of common-emitter configuration transistors;
   input and output terminals which are common to the differential amplifier and the common emitter amplifier, an input signal being input to the input terminals and an output signal output from the output terminals;
   a bias controller configured to control a bias of at least one of the differential amplifier and the common emitter amplifier; and
   a pair of capacitors connected between the input terminals and bases of the differential pair of transistors, and a pair of capacitors connected between the input terminals and bases of the common-emitter configuration transistors;
   wherein the bias controller comprises a bias level controller configured to apply a bias to at least one of the base of the differential pair of transistors and the base of the pair of common-emitter configuration transistors, and a current source connected to emitters of the differential pair of transistors.

3. An amplifier circuit according to claim 2 wherein the bias controller controls the bias of the common emitter amplifier to suppress third-order intermodulation distortion of the differential amplifier with an output current of the common emitter amplifier.

4. An amplifier circuit according to claim 2 which includes a pair of impedance elements connected to the emitters of at least one of the differential pair of transistors and the pair of common-emitter configuration transistors.

5. An amplifier circuit using a variable current source, comprising:
   a differential amplifier configured by a differential pair of transistors connected to the variable current source;
   a common emitter amplifier connected in parallel to the differential amplifier and conflaured by a pair of common-emitter conflauration transistors;
   input and output terminals which are common to the differential amplifier and the common emitter amplifier, an input signal being input to the input terminals and an output signal output from the output terminals;
   a bias controller configured to control a bias of at least one of the differential amplifier and the common emitter amplifier;

a pair of capacitors connected between the input terminals and bases of the differential pair of transistors, and a pair of capacitors connected between the input terminals and bases of the common-emitter configuration transistors; and a pair of cascade-connected transistors each of which is connected between the output terminal and a node of a collector of one of the differential pair of transistors and a collector of one of the pair of common-emitter configuration transistors.

6. An amplifier circuit according to claim 2 wherein the bias level controller applies a fixed bias level to the bases of the differential pair of transistors and a controllable bias level to the bases of the pair of common-emitter configuration transistors.

7. An amplifier circuit according to claim 2, wherein the bias controller includes a pair of first impedance elements connected to emitters of the differential pair of transistors, a pair of second impedance elements connected to emitters of the pair of common-emiffer configuration transistors, and a current source connected between the first impedance elements and a ground.

8. An amplifier circuit according to claim 2 wherein the bias level controller applies a fixed bias level to the bases of the pair of common-emitter configuration transistors and a controllable bias level to the bases of the differential pair of transistors.

9. A mixer device comprising an amplifier circuit of claim 2 and an additional differential amplifier connected between a node of the differential amplifier and the common emitter amplifier and the output terminal.

10. An amplifier circuit using a variable current source, comprising:

a differential amplifier configured by a differential pair of transistors connected to the variable current source;

a common emitter amplifier connected in parallel to the differential amplifier and configured by a pair of common-emitter configuration transistors;

input and output terminals which are common to the differential amplifier and the common emitter amplifier, an input signal being input to the input terminals and an output signal output from the output terminals;

a bias controller configured to control a bias of at least one of the differential amplifier and the common emitter amplifier;

a pair of capacitors connected between the input terminals and bases of the differential pair of transistors, and a pair of capacitors connected between the input terminals and bases of the common-emitter configuration transistors; and a first inductor connected to a first node of one of the differential pair of transistors and one of the pair of common-emitter configuration transistors as a load common to them, a first capacitor connected between the first node and the output terminal, a second capacitor connected to a second node of the other of the differential pair of transistors and the other of the pair of common-emitter configuration transistors as a load common to them, and a second inductor connected between the second node and the output terminal.

11. An amplifier circuit using a variable current source, comprising:

a differential amplifier configured by a differential pair of transistors connected to the variable current source;

a common emitter amplifier connected in parallel to the differential amplifier and configured by a pair of common-emitter configuration transistors;

input and output terminals which are common to the differential amplifier and the common emitter amplifier, an input signal being input to the input terminals and an output signal output from the output terminals;

a bias controller configured to control a bias of at least one of the differential amplifier and the common emitter amplifier; and a pair of capacitors connected between the input terminals and bases of the differential pair of transistors, and a pair of capacitors connected between the input terminals and bases of the common-emitter configuration transistors;

wherein the bias controller includes a pair of first impedance elements connected to emitters of the differential pair of transistors, a pair of second impedance elements connected to emitters of the pair of common-emitter configuration transistors, a variable current source connected between the first impedance elements and a ground, and a variable voltage source connected between the second impedance elements and the ground.

12. An amplifier circuit using a variable current source, comprising:

a differential amplifier configured by a differential pair of transistors connected to the variable current source;

a common emitter amplifier connected in parallel to the differential amplifier and configured by a pair of common-emitter configuration transistors;

input and output terminals which are common to the differential amplifier and the common emitter amplifier, an input signal being input to the input terminals and an output signal output from the output terminals;

a bias controller configured to control a bias of at least one of the differential amplifier and the common emitter amplifier; and a variable amplifier connected to output terminals of the differential amplifier and the common emitter amplifier and a gain controller connected to the variable amplifier and the bias controller and configured to control gains of the variable amplifier and the bias controller.

13. An amplifier circuit according to claim 1 which includes a pair of impedance elements connected to the emitters of at least one of the differential pair of transistors and the pair of common-base configuration transistors.

14. An amplifier circuit according to claim 1 wherein the third-order intermodulation distortion of the differential amplifier substantially equals to that of the common-emitter amplifier, and the phase of the differential amplifier is substantially reverse to that of the common-emitter amplifier.

15. An amplifier circuit comprising:

a first amplifier whose input-to-output characteristic indicates a hyperbolic tangent function characteristic;

a second amplifier whose input-to-output characteristic indicates an exponential characteristic, the second amplifier being connected in parallel to the first amplifier;

input and output terminals which are common to the first amplifier and the second amplifier; and a bias controller configured to control a bias of at least one of the first and second amplifier.

16. An amplifier circuit according to claim 15 wherein the first amplifier is configured by a differential amplifier and the second amplifier by a common-emitter amplifier.

17. An amplifier circuit comprising:

a differential amplifier whose input-to-output characteristic indicates a hyperbolic tangent function characteristic and which is configured by a differential pair of transistors connected to a variable current source;

a common emitter amplifier whose input-to-output characteristic indicates an exponential characteristic and which is connected in parallel to the differential amplifier and is configured by a pair of common-emitter configuration transistors;

input and output terminals which are common to the differential amplifier and the common emitter amplifier, an input signal being input to the input terminals and an output signal output from the output terminals; and a bias controller configured to control a bias of at least one of the differential amplifier and the common emitter amplifier.

18. An amplifier circuit comprising:

a differential amplifier whose input-to-output characteristic indicates a hyperbolic tangent function characteristic and which is configured by a differential pair of transistors whose emitters are connected to a variable current source;

a common emitter amplifier whose input-to-output characteristic indicates an exponential characteristic and which is connected in parallel to the differential amplifier and is configured by a pair of common-emitter configuration transistors whose emitters are grounded through a variable voltage source;

input and output terminals which are common to the differential amplifier and the common emitter amplifier, an input signal being input to the input terminals and an output signal output from the output terminals; and a bias controller configured to control a bias of at least one of the differential amplifier and the common emitter amplifier.

* * * * *